(12) United States Patent
Edelen et al.

(10) Patent No.: US 7,310,282 B2
(45) Date of Patent: Dec. 18, 2007

(54) DISTRIBUTED PROGRAMMED MEMORY CELL OVERWRITE PROTECTION

(75) Inventors: John Glenn Edelen, Versailles, KY (US); Nicole Marie Rodriguez, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 42 days.

(21) Appl. No.: 11/322,417

(22) Filed: Dec. 30, 2005

(65) Prior Publication Data

US 2007/0153608 A1 Jul. 5, 2007

(51) Int. Cl.
*G11C 17/18* (2006.01)

(52) U.S. Cl. ................... 365/225.7; 365/96

(58) Field of Classification Search .......... 365/225.7, 365/96
See application file for complete search history.

(56) References Cited

U.S. PATENT DOCUMENTS

| | | | |
|---|---|---|---|
| 5,264,725 A * | 11/1993 | Mullarkey et al. ......... 257/665 |
| 5,363,334 A * | 11/1994 | Alexander et al. ...... 365/185.04 |
| 5,596,535 A | 1/1997 | Mushya et al. |
| 5,901,093 A * | 5/1999 | Hiltebeitel et al. ......... 365/200 |
| 6,122,194 A | 9/2000 | Chung et al. |
| 6,125,066 A | 9/2000 | Gratz et al. |
| 6,459,640 B1 | 10/2002 | Tani et al. |
| 6,500,724 B1 * | 12/2002 | Zurcher et al. ............. 438/384 |
| 6,560,728 B2 | 5/2003 | Merritt |
| 6,654,272 B2 | 11/2003 | Santin et al. |
| 6,845,029 B2 | 1/2005 | Santin et al. |

\* cited by examiner

*Primary Examiner*—Richard T. Elms
*Assistant Examiner*—Eric Wendler
(74) *Attorney, Agent, or Firm*—Sutherland Asbill & Brennan

(57) ABSTRACT

A method and circuit for preventing the overprogramming of a memory cell. A fuse circuit is operable to be blown. A combinational logic circuit receives a signal from the fuse circuit, indicating whether or not the fuse has been blown, and controls the programming of the memory cell. The programming of the memory cell is prevented if the fuse circuit has been blown.

20 Claims, 5 Drawing Sheets

| Read Ref | Ref Column Not | Fuse Out | Ref Column Enable | |
|---|---|---|---|---|
| 0 | 0 | 0 | 1 | Write |
| 0 | 1 | 0 | 1 | |
| 1 | 0 | 0 | 1 | |
| 1 | 1 | 0 | 0 | Read |

FIG. 5

| Read Ref | Ref Column Not | Fuse Out | Ref Column Enable | |
|---|---|---|---|---|
| 0 | 0 | 1 | 0 | Write |
| 0 | 1 | 1 | 0 | |
| 1 | 0 | 1 | 1 | |
| 1 | 1 | 1 | 0 | Read |

FIG. 6

DISTRIBUTED PROGRAMMED MEMORY CELL OVERWRITE PROTECTION

FIELD OF THE INVENTION

The present invention is directed to a circuit for preventing the overprogramming of a memory circuit and, more particularly, a circuit for preventing the overprogramming of the floating gate reference cells of a memory circuit.

BACKGROUND OF THE INVENTION

A print head on a printer (e.g., an ink-jet printer) typically includes a memory circuit located directly on the print head for storing various data. For example, the memory circuit may store data such as the type of ink/toner cartridge being used, the type of printer, the amount of ink/toner used, diagnostic data and the like.

The memory circuit may be an array of memory cells. One such memory array is a floating gate memory array utilizing CMOS EPROM technology. The floating gate memory array is a two-dimensional array of memory cells, wherein each cell may be programmed to store data. An alternative memory array is a fuse memory array.

The memory array may operate as follows. Initially, each data cell is in a native (i.e., unprogrammed) state and therefore corresponds to a digital "0." The cell is programmed by converting the digital "0" into a digital "1" when a sufficient voltage (e.g., 10 volts) is applied to the cell.

Thus, data may be stored to the memory array by selectively programming cells in the array. In contrast, data may be read from the memory array by applying a second voltage to the cell (e.g., 2.5 volts) and measuring the current generated. The second voltage is not sufficient to write to (i.e., program) the cell. The generated current is compared to a reference current to determine whether a particular cell is programmed or unprogrammed.

The memory array may include at least one memory cell that functions as a reference cell and stores a programmed reference bit. Additionally, the memory array may include at least one memory cell that functions as a data cell and stores a data bit. As described in U.S. patent application Ser. No. 10/961,465, filed on Oct. 8, 2004 (Lexmark disclosure 20004-0644), which is incorporated by reference herein, the at least one programmed reference cell may be used to generate a reference current. Using a current sense amplifier, this reference current may be compared to the current of a data bit in the memory array to determine the state of the data bit. The state of the data bit will be a digital one if the data bit is programmed. Alternatively, the state of the data bit will be a digital zero if the data bit is not programmed.

If the reference bit is over programmed, meaning it has been programmed multiple times, the data bit may be read incorrectly when compared to the reference bit. Accordingly, there is a need for a method of preventing the accidental or intentional over programming of a reference bit in the memory array.

SUMMARY OF THE INVENTION

According to one embodiment of the invention, there is disclosed a circuit for preventing the overprogramming of a memory cell. The circuit includes a fuse circuit operable to be blown. The circuit also includes a combinational logic circuit that receives a signal from the fuse circuit and controls the programming of the memory cell, wherein programming of the memory cell is prevented if the fuse circuit has been blown.

According to one aspect of the present invention, the memory cell may be a floating gate memory cell. According to another aspect of the present invention, the memory cell may be a fuse memory cell. According to yet another aspect of the present invention, the fuse circuit includes a resistive fuse element that is blown subsequent to the programming of the memory cell. The resistive fuse element may be comprised of TaAlN. Additionally, the resistive fuse element may have a resistance of approximately 90 ohms.

According to another aspect of the present invention, the fuse circuit and the combinational logic circuit permit the memory cell to be read both before and after the fuse circuit has been blown. According to yet another aspect, an output of the fuse circuit controls a selection of inputs to a multiplexer contained in the combinational logic circuit. The output of the fuse circuit may be a relatively high voltage when the fuse circuit has not been blown. The relatively high voltage may correspond to a digital "1." Additionally, the output of the fuse circuit may be a relatively low voltage when the fuse circuit has been blown. The relatively low voltage may correspond to a digital "0."

According to another embodiment of the present invention, there is disclosed a method for preventing the overprogramming of a memory cell. The method includes applying a write signal to a fuse circuit when the memory cell is programmed. The applied write signal functions to blow the fuse circuit. A control signal indicating whether the fuse circuit has been blown is output from the fuse circuit and received by a combinational logic circuit. The combinational logic circuit determines whether the memory cell can be programmed based on the received control signal.

According to an aspect of the present invention, the memory cell may be a floating gate memory cell. According to another aspect, the memory cell may be a fuse memory cell. According to yet another aspect, the fuse circuit includes a resistive fuse element that is blown after the memory cell has been programmed. The resistive fuse element may be comprised of TaAlN. Additionally, the resistance of the resistive fuse element may be 90 ohms.

According to another aspect of the present invention, the fuse circuit and the combinational logic circuit permit the memory cell to be read both before and after the fuse circuit has been blown. According to yet another aspect, the control signal received by the combinational logic circuit controls a selection of inputs to a multiplexer contained in the combinational logic circuit. The output of the fuse circuit may be a relatively high voltage when the fuse circuit has not been blown. The relatively high voltage may correspond to a digital "1." Additionally, the output of the fuse circuit may be a relatively low voltage when the fuse circuit has been blown. The relatively low voltage may correspond to a digital "0."

Other embodiments, objects, features and advantages of the present invention will become apparent to those skilled in the art from the detailed description, the accompanying drawings and the appended claims.

BRIEF DESCRIPTION OF THE DRAWINGS

Figure 1:
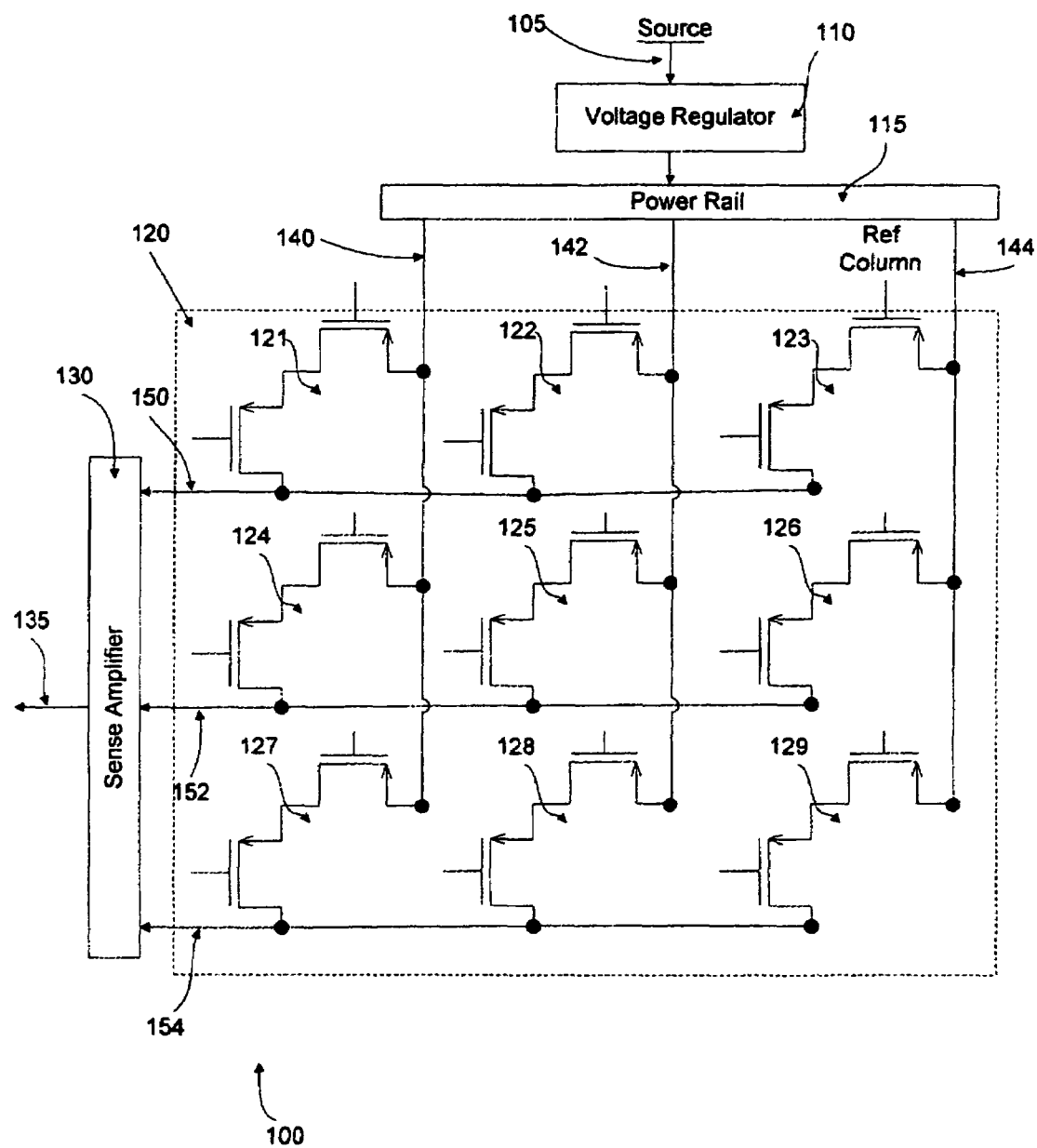

Having thus described the invention in general terms, reference will now be made to the accompanying drawings, which are not necessarily drawn to scale, and wherein:

FIG. 1 is a schematic diagram of a memory circuit which may be used in conjunction with the present invention.

Figure 2:
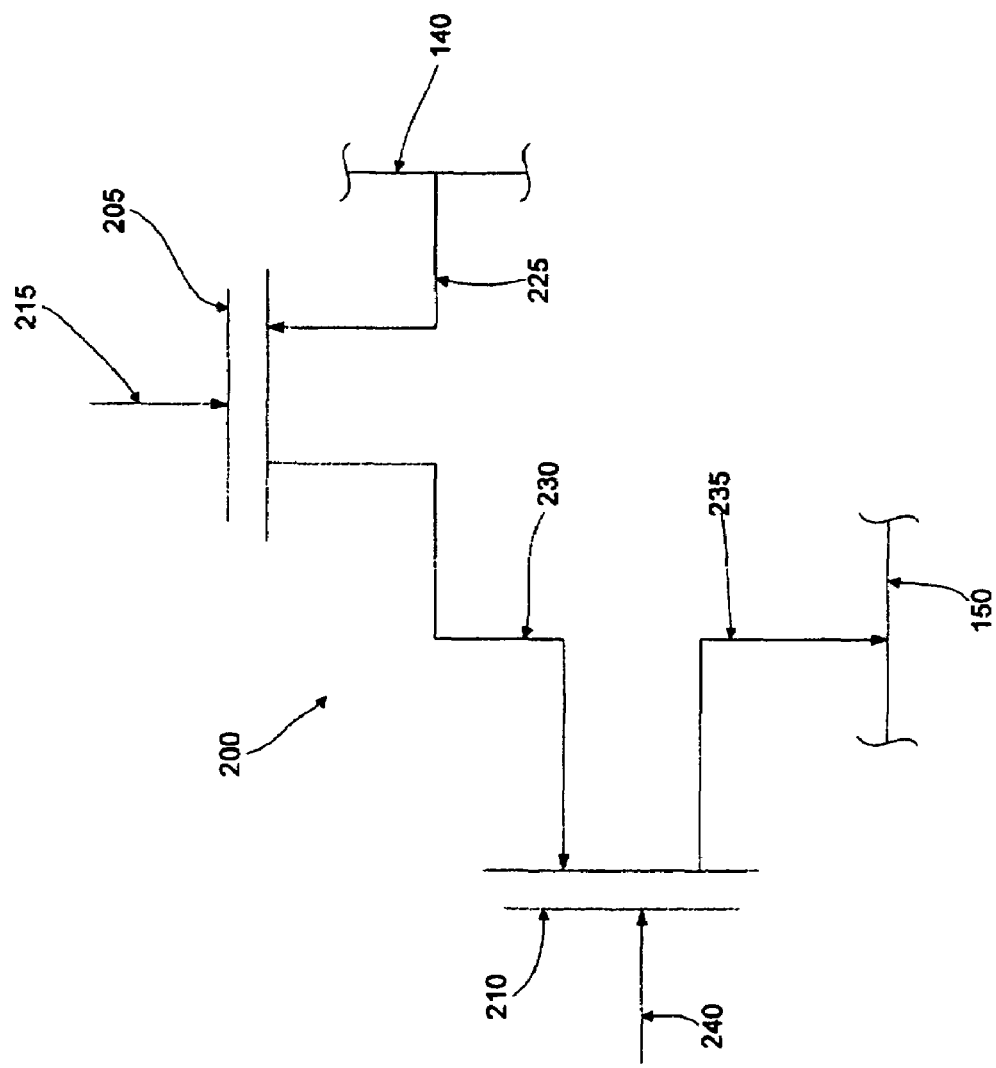

FIG. 2 is a schematic diagram of a memory cell of the memory circuit of FIG. 1.

Figure 3:
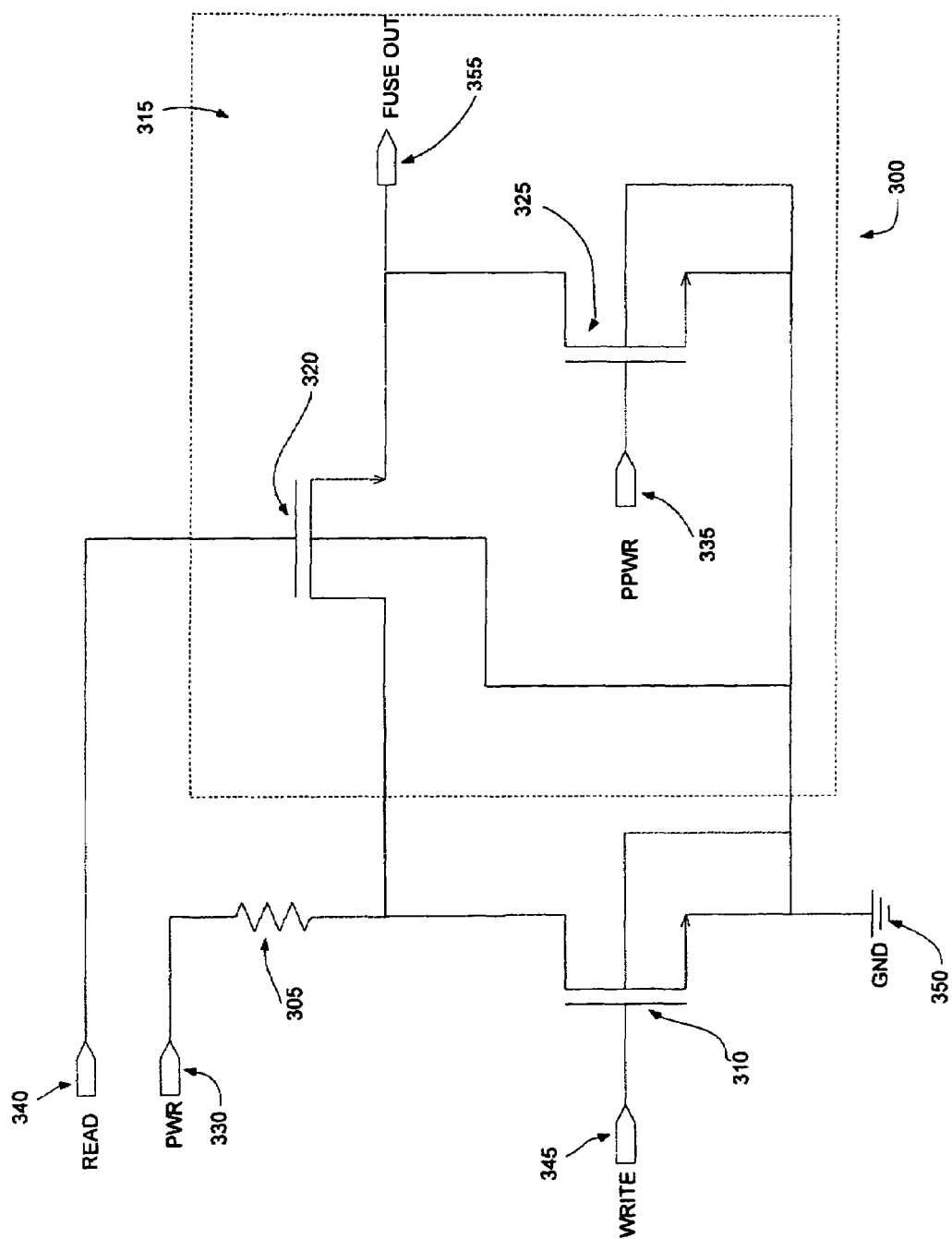

FIG. 3 is a schematic diagram of a fuse circuit, according to an illustrative embodiment of the present invention.

Figure 4:
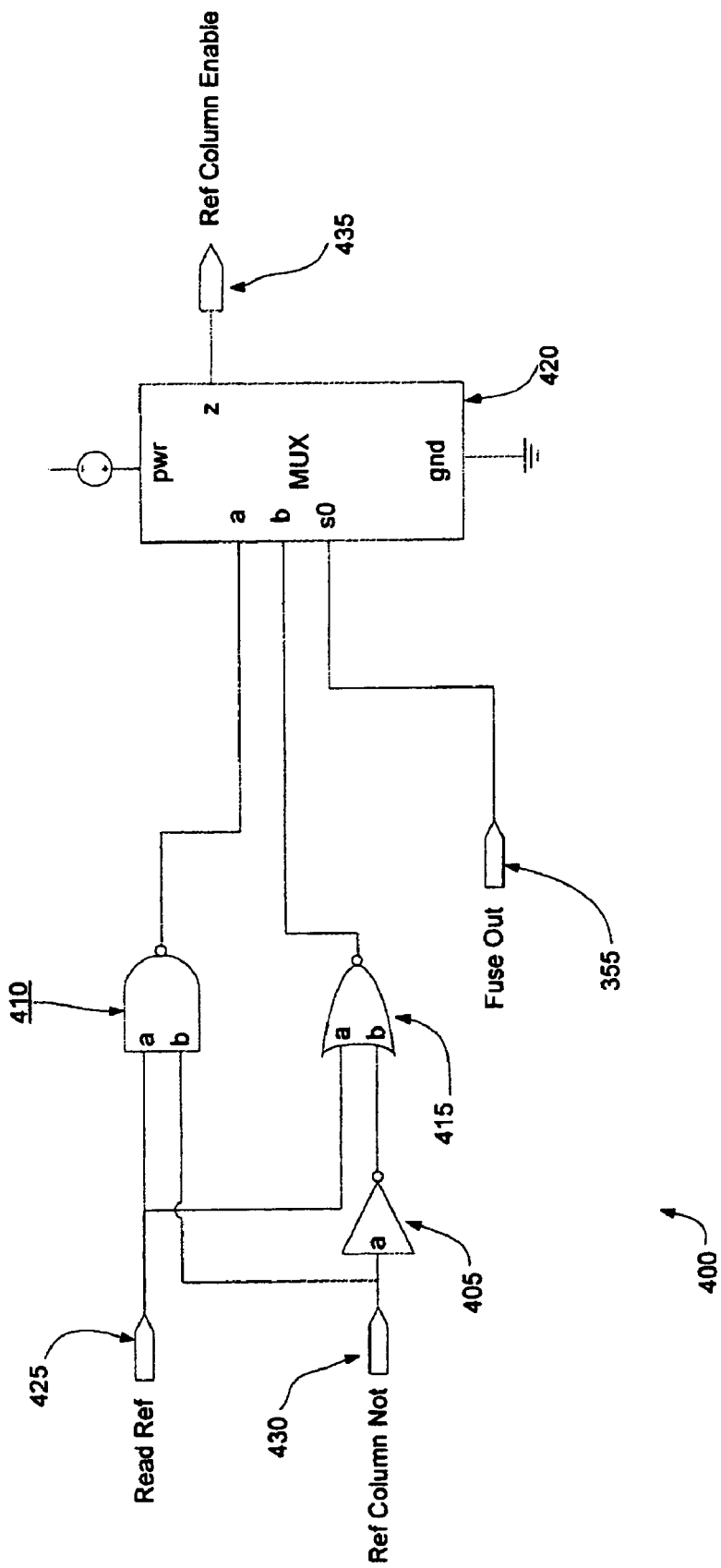

FIG. 4 is a schematic diagram of a combinational logic circuit, according to an illustrative embodiment of the present invention.

FIG. 5 is a table of the possible states of the combinational logic circuit when the fuse circuit has been blown.

FIG. 6 is a table of the possible states of the combinational logic circuit when the fuse circuit has not been blown.

DETAILED DESCRIPTION

The present inventions now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

FIG. 1 is a schematic diagram of a memory circuit that may be used in conjunction with the present invention. As shown in FIG. 1, memory circuit 100 can include a source, such as a voltage source or input 105, a voltage regulator 110, a power rail 115, an array 120 of memory cells 121, 122, 123, 124, 125, 126, 127, 128, 129, a sense amplifier 130, an output 135, feed lines 140, 142, 144 and exit lines 150, 152, 154.

The voltage regulator 110 regulates the voltage source or input 105 (e.g., 11 volts), which may be a battery, a connection to a printer power source (not shown) or the like, between a first voltage, corresponding to a read mode (e.g., 2.5 volts), and a second voltage, corresponding to a write mode (e.g., 10 volts). An example of an acceptable voltage regulator 110 for use according to the present invention is the voltage regulating circuit described in U.S. patent application Ser. No. 10/961,465, filed on Oct. 8, 2004, the entire contents of which are incorporated herein by reference. The power rail 115 distributes the first and second voltages (depending on whether the circuit 100 is in the read mode or the write mode) throughout the array 120 of memory cells 121, 122, 123, 124, 125, 126, 127, 128, 129 by way of the feed lines 140, 142, 144.

The array 120 may be a two-dimensional array of cells 121, 122, 123, 124, 125, 126, 127, 128, 129 comprised of X number of columns and Y number of rows to provide Z number of memory cells, where Z is equal to X times Y. The array 120 may be a floating gate memory array, a fuse memory array or other like memory array. For example, as illustrated in FIG. 1, the array 120 includes three columns and three rows for a total of nine memory cells 121, 122, 123, 124, 125, 126, 127, 128, 129. At this point, it should be obvious to one skilled in the art that the array 120 may include any number of rows and columns without departing from the scope of the present invention.

FIG. 2 is an enlarged view of a memory cell 200, which is representative of at least one of cells 121, 122, 123, 124, 125, 126, 127, 128, 129. Cell 200 includes a first transistor 205, a second transistor 210 that acts as a memory element, a first control input 215, input lead 225, connecting lead 230 and output lead 235. Input lead 225 is connected to feed line 140 and transistor 205. Connecting lead 230 is connected to transistor 205 and transistor 210. Output lead 235 is connected to transistor 210 and exit line 150. The first control input 215 controls transistor 205 (i.e., switches transistor 205 on (active) such that current/voltage can pass or switches transistor 205 off (inactive) such that current/voltage cannot pass) by applying various voltages to the transistor 205. Transistor 210 acts as a memory element. Programming 210 causes the transistor 210 to behave as if the transistor control input 240 is active and the transistor 210 is switched on and passing voltage/current. Leaving transistor 210 in the unprogrammed or native state causes the transistor 210 to behave as if the transistor control input 240 is inactive and the transistor 210 is switched off and not passing voltage/current. A two terminal fuse element connected between lead 225 and 235 is an alternative to transistors 210 and 215. When both transistors 205, 210 are active (i.e., switched on), current/voltage may enter and pass through the cell 200 (i.e., voltage may be applied to the cell by way of input lead 225 connected to the feed line 140 and output 235 connected to feed line 150.

At least one of the cells 121, 122, 123, 124, 125, 126, 127, 128, 129 in the array 120 (see FIG. 1) is designated as a reference memory cell and the remaining cells can be data memory cells. The reference memory cell may be initially programmed (e.g., be applying 10 volts) such that, when a read mode voltage (e.g., 2.5 volts) is applied to the reference cell, a reference current is generated that corresponds to a programmed cell. Alternatively, the reference cell may remain in its native state such that, when a read mode voltage is applied to the reference cell, a reference current is generated that corresponds to an unprogrammed cell.

A better comparison is obtained between a generated current (i.e., a current generated by a data cell when the data cell is being read) and the reference current when the reference current is generated within the array 120. Furthermore, a reference current generated within the array 120 addresses the problems associated with variation in the read/write current or voltage because the reference cell or cells will be subjected to the same process variations (e.g., voltage variations) as the data cells in the array 120. It will be understood that a reference voltage or some other measurement could also be obtained from a reference cell in order to make a comparison between the reference cell and a memory cell in the array 120.

For example, cell 123 may be designated as a reference memory cell and cells 121, 122, 124, 125, 126, 127, 128, 129 may be data memory cells. Cell 123 may be initially programmed such that it provides a reference current when a read voltage is applied to the cell 123. Accordingly, when the circuit 100 desires to read cell 127, for example, a read voltage (e.g., 2.5 volts) is provided to the array 120 by the power rail 115, control input 215 activates transistor 205 and programming has activated transistor 210 in the reference cell 123 and in the data cell 127, such that the reference cell 123 and the data cell 127 generate a current. The reference current from the reference cell 123 is supplied to the sense amplifier 130 by way of exit line 150 and the generated current from data cell 127 is supplied to the sense amplifier 130 by way of exit line 154. The sense amplifier 130 compares the reference current to the generated current and generates an output 135. The output 135 may be a high voltage (corresponding to a digital 1) when the reference current is substantially equal to the generated current (i.e., data cell 127 is programmed) or the output 135 may be a low voltage (corresponding to a digital 0) when the reference current is not equal to the generated current (i.e., data cell 127 is not programmed).

Alternatively, an entire column of the array 120 may consist of reference cells. For example, cells 123, 126, 129 may be reference cells and cells 121, 122, 124, 125, 127, 128 maybe data cells. Therefore, the generated current from data cells in a particular row may be compared to a reference current generated by a reference cell in that particular row such that vertical variations in the applied voltage may be tracked. It is also possible for an entire row of the array 120 to consist of reference cells.

According to an aspect of the present invention, a reference cell may only be programmed one time. If a reference cell is programmed, or written to, more than one time, it may subsequently be read incorrectly. FIG. 3 depicts a fuse circuit 300, according to an illustrative embodiment of the present invention. According to one aspect of the present invention, the resistive fuse element 305 of the fuse circuit 300 is a one-time writable fuse. After a reference memory cell is programmed the first time, the resistive fuse element 305 may be blown, preventing subsequent writing to the reference memory cell. When the resistive fuse element 305 is not blown, the reference memory cell may be addressed normally and programmed or written to. After the resistive fuse element 305 is blown, writing to the reference memory cell is not allowed, as will be explained in greater detail below.

The fuse circuit 300 shown in FIG. 3 may include a resistive fuse element 300, a fuse transistor 310 and a voltage divider network 315. Further, the voltage divider network 315 may include a first voltage divider transistor 320 and a second voltage divider transistor 325. The fuse circuit 300 may also include a first power input 330, a second power input 335, a read input 340, a write input 345, a ground connection 350, and a fuse output 355. The first power input 330 is connected to the resistive fuse element 305, while the second power input 335 controls the second voltage divider transistor 325. The read input 340 controls the first voltage divider transistor 320 and the write input 345 controls the fuse transistor 310. The resistive fuse element 305 is connected to the drain of both the fuse transistor 310 and the first voltage divider transistor 320, as will be understood by those skilled in the art. The source of both the fuse transistor 310 and the second voltage divider transistor 325 are connected to ground 350. The source of the first voltage divider transistor 320 and the drain of the second voltage divider transistor 325 are connected to the fuse output 355.

The resistive fuse element 305 may be formed of TaAlN, but it may be formed of other materials such as polysilicon, Ta, TiN, or some other material known to those of ordinary skill in the art. According to an embodiment of the present invention, the resistance of the resistive fuse element 305 is approximately 90 ohms, but it will be appreciated that a fuse element 305 with a different resistance may be used in the present invention, provided that the fuse element 305 is blown when a write signal is applied to the fuse circuit 300, as described below. The fuse transistor 310, first voltage divider transistor 320 and second voltage divider transistor 325 may be NMOS devices, as will be understood by those skilled in the art, but it is also possible to construct the present invention by using other types of transistors such as PMOS transistors or field effect transistors (FET).

When the fuse circuit 300 is in use, a first voltage source (not shown) is applied to the first power input 330. This voltage source applies 11.0 V to the power input 330 and may be a battery, a connection to a power source, or a similar device. The first voltage source may be the voltage source 105 used by the memory circuit 100 described above. A second voltage source (not shown) supplies 7.5 V to the second power input 335. The second voltage source may be a separate device, such as a battery or power source connection, or it may be obtained by using a voltage regulator or voltage divider in conjunction with the first voltage source. The ground connection 350 is connected to either 0 V or to earth ground.

According to an aspect of the present invention, the fuse circuit 300 may be used in conjunction with either a read command or a write command to a reference memory cell. Once a reference cell has been written to, the resistive fuse element 305 of the fuse circuit 300 will be blown and further write commands will be prevented. In order to write to a reference memory cell and blow the resistive fuse element 305, a voltage of approximately 7.5 V is applied to the write input 345 while a voltage of approximately 0 V is applied to the read input 340. Due to the applied voltages, the fuse transistor element 310 will be turned on while the first voltage divider transistor 320 is held off. If the resistance of the resistive fuse element 305 is approximately 90 ohms, approximately 100 mA of current will flow through the resistive fuse element 305. Because of the high current density in the resistive fuse element 305, the material will melt, resulting in an open circuit in the fuse circuit 300. According to an aspect of the present invention, the time required to melt the resistive fuse element 305 and open the fuse circuit 300 is less than 500 ns.

The fuse circuit 300 may also be used in conjunction with a read command to a reference memory cell. If a read command is performed before a reference memory cell is written to, the fuse output 355 of the fuse circuit 300 will be a logical 1, indicating that the reference memory cell has not be programmed. A subsequent write command resulting in a programming of the reference cell would then be permitted. Conversely, if a read command is performed after a reference memory cell has been programmed, the fuse output 355 of the fuse circuit 300 will be a logical 0, and a subsequent programming of a reference memory cell will not be permitted.

In order to read the state of the fuse circuit 300 and determine whether or not a reference memory cell has been programmed, a voltage of approximately 7.5 V is applied to the read input 340 while a voltage of approximately 0 V is applied to the write input 345. Due to the applied voltages, the fuse transistor 310 will be held off and the first voltage divider transistor 320 will be turned on. If the resistive fuse element 305 has not been blown, the resistive fuse element 305 is connected in series with the first voltage divider transistor 320 and the second voltage divider transistor 325. A voltage divider is formed and the fuse output 355 is approximately 3.3 V, which will be interpreted as a logical 1 by the combinational logic described below. The first voltage divider transistor 320 and second voltage divider transistor 325 are sized so that the current through the resistive fuse element 305 during a read command is limited to approximately 500 uA. According to an aspect of the present invention, the current through the resistive fuse element 305 during a read command is not sufficient to melt the resistive fuse element 305 and open the fuse, even if the fuse circuit 300 is held in the read state for an extended period of time.

If a read command is performed after the resistive fuse element 305 has been blown, no current will flow through the first voltage divider transistor 320. The second voltage divider transistor 325 will then pull the fuse output 355 to 0 V, which will be interpreted as a logical 0 by the combinational logic described below.

FIG. 4 shows a combinational logic circuit 400 used in conjunction with the fuse circuit 300, according to an illustrative embodiment of the present invention. Combinational logic circuit 400 is made up of an inverter 405, a nand gate 410, a nor gate 415, and a multiplexer 420. Inputs Read Ref 425 and Ref Column Not 430 are input into the combinational logic circuit 400. Read Ref 425 designates that reading of a reference cell is enabled when it is set to a logic 1 or that reading of a reference cell is disabled when it is set to a logic 0. Ref Column Not 430 designates which memory function is being selected for a reference column. It is set to a logic 1 for a read function and set to a logic 0 for a write function. Read Ref 425 and Ref Column Not 430 are input into nand gate 410, and the output of the nand gate 410 is fed into the first input of the multiplexer 420. Additionally, Ref Column Not 430 is fed into an inverter 405 and the output of inverter 405 is fed into the nor gate 415. Read Ref is also fed into nor gate 415. The output of nor gate 415 is fed into the second input of multiplexer 420. According to an aspect of the present invention, the fuse output 355 of the fuse circuit 300 controls the input selection of multiplexer 420. The fuse output 355 is used as the selector bit for multiplexer 420. If the fuse output 355 is a logic 0, corresponding to a blown fuse, the first input (from nand gate 410) to multiplexer 420 is chosen. If the fuse output 355 is a logic 1, indicating that the fuse circuit 300 has not been blown, then the second input (from nor gate 415) to multiplexer 420 is chosen. When the fuse circuit 300 has not been blown, both reading and writing to a memory reference bit will be allowed. When the fuse circuit 300 has been blown, only a read of a memory reference bit will be allowed. Ref Column Enable 435 is the output of multiplexer 420. In order to access a reference memory cell for either a read or a write, the multiplexer output Ref Column Enable 435 must be a logic 0.

FIG. 5 is a table of the possible states of the combinational logic circuit 400 when the fuse circuit 300 has been blown. The fuse output 355 is a logical 0 in all of the states of FIG. 5, indicating that the fuse circuit 300 has been blown. Therefore, the first input to multiplexer 420, representing the output of nand gate 410 will be chosen in all of the states of FIG. 5. Ref Column Enable 435, the output of multiplexer 420, will be the same as the output of nand gate 410. In order to read a memory reference cell after the fuse has been blown, a logic 1 will be applied to both Read Ref 425 and Ref Column Not 430. The output of nand gate 410, which is also the first input to multiplexer 420, will be a logic 0. Because the fuse circuit 300 has been blown, fuse output 355 is a logic 0 and the first input to multiplexer 420 will be selected, causing the output of the multiplexer Ref Column Enable 435 to be a logic 0. Therefore, a read of a memory reference cell will be allowed.

In order for a write command and a programming of a memory reference cell to be allowed, the output Ref Column Enable 435 must be held low (logic 0) while input Read Ref 425 and Ref Column Not 430 are set low (logic 0). If Read Ref 425 and Ref Column Not 430 are both set to a logic 0, the output of nand gate 410 will be a logic 1. When the first input to multiplexer 420 is selected by the fuse output 355 (due to the fuse being blown), the output Ref Column Enable will be a logic 1 rather than a logic 0. Therefore, a write command to a memory reference cell will be prevented when the fuse circuit 300 has been blown. The two other combinations of inputs or states shown in FIG. 5 are indeterminate states where it does not matter what the output is. These states correspond to Read Ref 425 being set low while Ref Column Not 430 is set high and to Read Ref 425 being set high while Ref Column Not 430 is set low. In both cases, the output at Ref Column Enable 435 will be forced to a logic 1, preventing either read or write access to a memory reference cell.

FIG. 6 is a table of the possible states of the combinational logic circuit 400 when the fuse circuit 300 has not been blown. The fuse output 355 is a logical 1 in all of the states of FIG. 6, indicating that the fuse circuit 300 has not been blown. Therefore, the second input to multiplexer 420, representing the output of nor gate 415 will be chosen in all of the states of FIG. 6. Before the fuse circuit 300 is blown, both a read command and a write command to a memory reference cell will be allowed. Ref Column Enable 435, the output of multiplexer 420, will be the same as the output of nor gate 415. In order to read a memory reference cell, a logic 1 will be applied to both Read Ref 425 and Ref Column Not 430. The output of nor gate 415, which is also the second input to multiplexer 420, will be a logic 0. Because the fuse circuit 300 is intact, fuse output 355 is a logic 1 and the second input to multiplexer 420 will be selected, causing the output of the multiplexer Ref Column Enable 435 to be a logic 0. Therefore, a read of a memory reference cell will be allowed.

In order for a write command and a programming of a memory reference cell to be allowed, the output Ref Column Enable 435 must be held low (logic 0) while input Read Ref 425 and Ref Column Not 430 are set low (logic 0). If Read Ref 425 and Ref Column Not 430 are both set to a logic 0, the output of nor gate 415 will be a logic 0. When the second input to multiplexer 420 is selected by the fuse output 355 (due to the fuse being intact), the output Ref Column Enable will be a logic 0, allowing a write command to a memory reference cell. Therefore, a write command to a memory reference cell will be allowed when the fuse circuit 300 is still intact. The two other combinations of inputs or states shown in FIG. 6 are indeterminate states where it does not matter what the output is before the fuse has been blown.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A circuit to prevent the overprogramming of a reference memory cell, comprising:
   a reference memory cell capable of being initially programmed to generate a reference current indicative of whether the reference memory cell is a programmed or unprogrammed cell;
   a fuse circuit, wherein the fuse circuit is operable to be blown subsequent to the programming of the reference memory cell; and
   a combinational logic circuit that receives a signal from the fuse circuit and controls the programming of the reference memory cell, wherein programming of the reference memory cell is prevented if the fuse circuit has been blown.

2. The circuit of claim 1, wherein the reference memory cell is a floating gate memory cell.

3. The circuit of claim 1, wherein the reference memory cell is a fuse memory cell.

4. The circuit of claim 1, wherein the fuse circuit includes a resistive fuse element that is blown after the reference memory cell has been programmed.

5. The circuit of claim 1, wherein the fuse circuit and the combinational logic circuit permit the reference memory cell to be read both before and after the fuse circuit has been blown.

6. The circuit of claim 1, wherein an output of the fuse circuit controls a selection of inputs to a multiplexer contained in the combinational logic circuit.

7. The circuit of claim 4, wherein the resistive fuse element is comprised of TaAlN.

8. The circuit of claim 4, wherein the resistive fuse element has a resistance of approximately 90 ohms.

9. The circuit of claim 6, wherein the output is a relatively high voltage when the fuse circuit has not been blown.

10. The circuit of claim 6, wherein the output is a relatively low voltage when the fuse circuit has been blown.

11. The circuit of claim 9, wherein said high voltage corresponds to a digital "1."

12. The circuit of claim 10, wherein said low voltage corresponds to a digital "0."

13. A method for preventing the overprogramming of a reference memory cell, comprising:
    providing a reference memory cell capable of being initially programmed to generate a reference current indicative of whether the reference memory cell is a programmed or unprogrammed cell;
    applying a write signal to a fuse circuit when the reference memory cell is programmed;
    blowing the fuse circuit upon application of the write signal;
    outputting a control signal from the fuse circuit indicating whether the fuse circuit has been blown;
    receiving the control signal in a combinational logic circuit; and
    determining whether the reference memory cell can be programmed based on the received control signal.

14. The method of claim 13, wherein the reference memory cell is a floating gate memory cell.

15. The method of claim 13, wherein the reference memory cell is a fuse memory cell.

16. The method of claim 13, wherein the fuse circuit includes a resistive fuse element that is blown after the reference memory cell has been programmed.

17. The method of claim 13, wherein the resistive fuse element is comprised of TaAlN.

18. The method of claim 13, wherein the resistive fuse element has a resistance of approximately 90 ohms.

19. The method of claim 13, wherein the fuse circuit and the combinational logic circuit permit the reference memory cell to be read both before and after the fuse circuit has been blown.

20. The method of claim 13, wherein the control signal controls a selection of inputs to a multiplexer contained in the combinational logic circuit and wherein the control signal is a relatively high voltage when the fuse circuit has not been blown.

* * * * *